United States Patent [19]

Farley

[11] Patent Number: 5,047,721

[45] Date of Patent: Sep. 10, 1991

[54] FAULTY LAMP TESTER

[76] Inventor: Earl T. Farley, 3213 22nd St., Lubbock, Tex. 79410

[21] Appl. No.: 562,743

[22] Filed: Aug. 6, 1990

[51] Int. Cl.⁵ .......................................... G01R 31/22
[52] U.S. Cl. ................................. 324/414; 324/403; 324/515; 324/530; 324/556; 324/133
[58] Field of Search ............... 324/530, 527, 528, 519, 324/515, 512, 522, 690, 414, 403, 555, 556, 523, 537, 530, 133, 724, 149, 72.5; 340/652; 641, 642

[56] References Cited

U.S. PATENT DOCUMENTS

| | | | |
|---|---|---|---|
| 1,745,419 | 2/1930 | Henneberger | 324/503 X |
| 2,461,962 | 2/1949 | Carlson | 315/183 X |
| 2,503,677 | 4/1950 | McHenry | 324/556 X |
| 2,907,949 | 10/1959 | Rogers et al. | 324/72.5 |
| 4,052,665 | 10/1977 | Gruenwald | 324/530 |
| 4,617,519 | 10/1986 | Rosenthal | 324/414 |

Primary Examiner—Kenneth A. Wieder
Assistant Examiner—Robert W. Mueller
Attorney, Agent, or Firm—Ross, Howison, Clapp & Korn

[57] ABSTRACT

A detector (42) is provided for testing a string of lamps (12) that are connected to a wire (14) in a series configuration. The detector (42) has a probe (44) disposed on the end thereof with a cavity (56) formed therein. The cavity (56) is operable to be disposed around the socket (30) of lamp (12). The electrodes (34) and (36) disposed in the interior of the socket (30) are disposed parallel to two electrodes (60) and (62) that are embedded in the probe (44). A detector circuit is provided for detecting the presence of an AC signal capacitively coupled from one of the electrodes (34) and (36) to one of the capacitive plates (60) and (62), respectively. A large DC signal will be present for a defective bulb having at least one of the electrodes (34) or (36) connected to one side of an AC supply (18).

6 Claims, 2 Drawing Sheets

FAULTY LAMP TESTER

TECHNICAL FIELD OF THE INVENTION

The present invention pertains in general to lamp testers, and more particularly, to a lamp tester for detecting the location of a faulty lamp in a string of Christmas tree or festive lights.

BACKGROUND OF THE INVENTION

Christmas or festive lights are typically organized as a string of sockets and cooperating lights, which lights are electrically connected in a series configuration. Therefore, when one lamp is faulty, the entire string fails to light. It is necessary therefore to locate the one faulty lamp and replace it. If there is more than one faulty lamp, it is necessary to locate multiple lamps. Typically, this requires extracting each lamp and inserting a known good lamp therefor. For a string having upward of fifty lamps, this can be time consuming.

SUMMARY OF THE INVENTION

The invention present disclosed and claimed herein comprises an apparatus for testing for faulty lights in a string of lights. Each of the lights has associated therewith a light socket with at least first and second contacts disposed therein. The contacts are operable to contact the electrodes on either side of a light bulb. The first and second contacts are disposed in a substantially parallel relationship and spaced a predetermined distance apart. The socket is operable to support the light bulb. A first capacitive plate and a second capacitive plate are provided. A support supports both the first and second capacitive plates in a substantially parallel relationship and spaced a distance apart that is greater than the distance between the first and second contacts. A support is provided for the first and second plates and having a cavity formed therebetween for receiving the socket and disposing the first and second plates proximate to the first and second contacts and substantially aligned therewith. A detector circuit detects a voltage difference between the first and second capacitor plates and activates a display device, indicating the presence of the voltage. The presence of the voltage indicates an open circuit.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
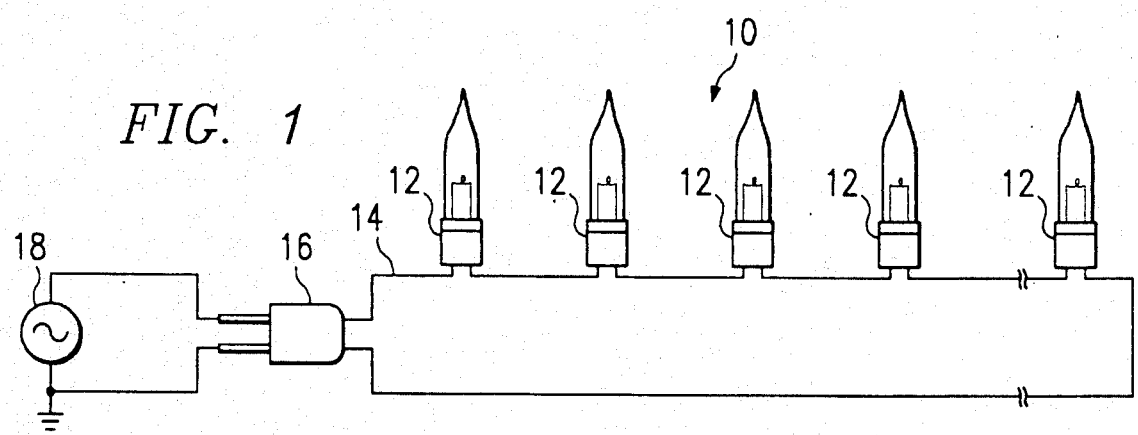
FIG. 1 illustrates a layout schematic for a conventional light string and its connection thereto with an AC source.

Referring now to FIG. 1, there is illustrated a diagrammatic view of a lamp string 10. The lamp string 10 is comprised of a plurality of lamps 12 that are disposed in a series relationship along a wire 14. The wire 14 is configured in a loop configuration and connects to an AC plug 16. The AC plug 16 is interfaced with an AC source 18 having a ground side represented by a ground symbol and the other side constituting the high side of the AC supply 18. The lamps 12 are typically disposed a predetermined distance apart, and there may be as many as fifty lamps 12 disposed in a string. Since the lamps 12 are disposed in series, the defective one of the lamps 12 will result in an open circuit in the string.

Figure 2:
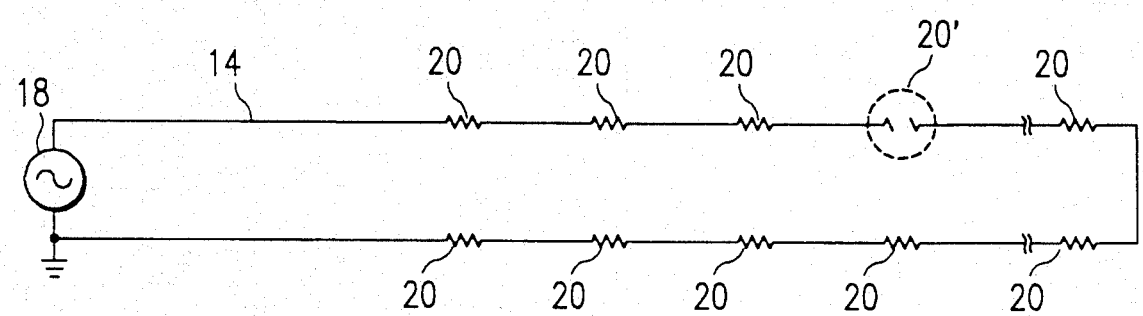
FIG. 2 illustrates an electrical schematic of a light string with a break in one of the lights.

Referring now to FIG. 2, there is illustrated an electrical schematic of the lamp string 10 of FIG. 1. Each of the lamps 12 is represented by a resistor 20. The resistors 20 are disposed in series in the wire 14 and connected to the other side of the AC source 18. When the full voltage of the AC supply 18 is disposed across the string of resistors 20, each of the resistors 20 will have a voltage drop across the two terminals thereof. If, for example, there were fifty lamps 12 in the string 10, each of the resistors 20 would have one-fiftieth of the voltage of the AC source 10 imposed across the resistor 20. If, however, one of the resistors 20 were to open circuit, there would be no voltage drop across any of the resistors 20.

In the electrical diagram of FIG. 2, one of the resistors is illustrated as being open circuited, this resistor illustrated as element 20'. The side of the resistor element 25 that is connected to the high side of the AC source 18 will have the full voltage of the AC source 18 disposed on that side and the other side thereof will be disposed at the low side or ground side of the AC source 18. This is due to the fact that no current flows through any of the resistors 20 that are not open circuited. This assumes that none of the other resistors 20 are open circuited. If a voltmeter were utilized in the electrical schematic of FIG. 2 with the element 20' being present as an open circuit, the voltmeter when attached to any point along the wire 14 on the high side of element 20' would register the full voltage of the AC source 18 relative to the low side thereof. However, if the voltage probe were disposed on the low side of the element 20', there would be no voltage present relative to the low side.

Figure 3:
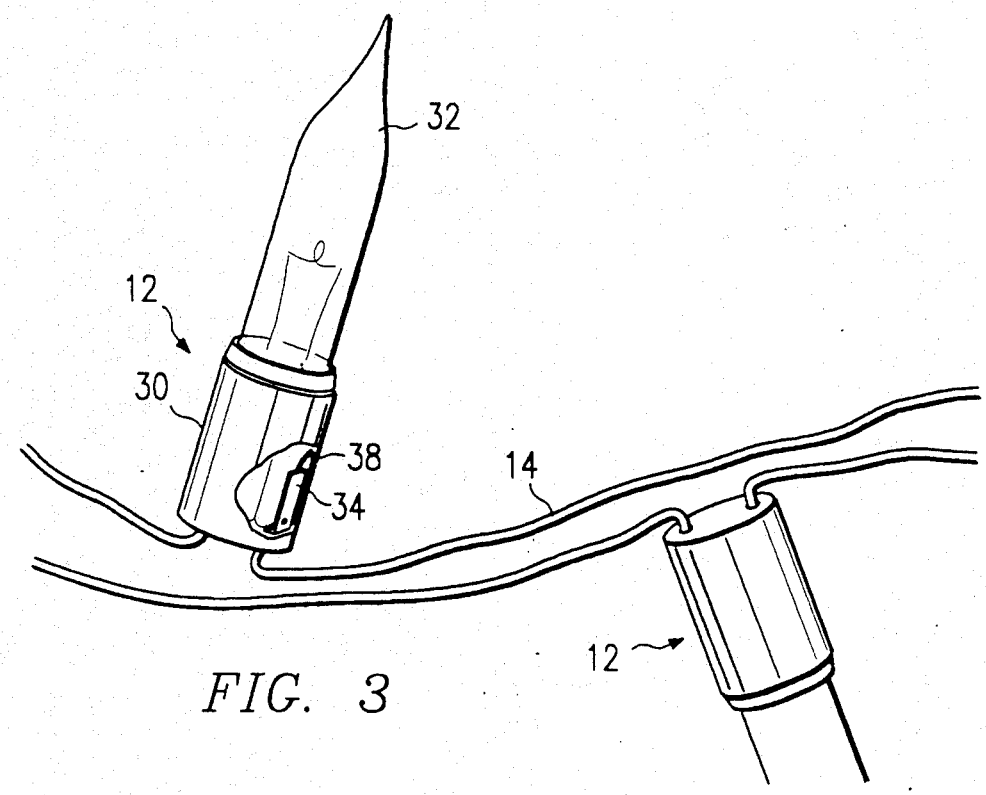
FIG. 3 illustrates a perspective view of a typical light socket.

Referring now to FIG. 3, there is illustrated a detailed view of the light 12 and the resistor string in the wire 14. In typical Christmas tree lights which are marketed under the name "Miniature Lights", there is a socket 30 that is operable to receive a bulb 32. The socket 30 has disposed therein two electrodes 34 and 36 (not shown). The electrodes 34 and 36 are each connected to the wire 14 such that the wire 14 is essentially open circuited between the two electrodes 34 and 36. The electrodes 34 and 36 are formed on the interior of the socket 30 and disposed a predetermined distance apart and in a substantially parallel relationship. The bulb 32 has a small wire 38 extending up one side and another wire (not shown) disposed up the diametrically opposite side thereof. The wire 38 communicates with the interior of the bulb 32 as one of the electrodes. The wire 38 is wrapped up around the side extending from the bottom of the bulb 32 and upward such that it will contact the interior side of the electrode 34 when the bulb 32 is disposed in the socket 30.

Whenever one of the lamps 12 has a failure associated therewith, due to the bulb 32 failing, an open circuit results. However, the only way in the past to have determined the presence of the faulty bulb 32 was to sequentially replace each of the bulbs 32. This of course was very time consuming. However, the presence of the open circuit results in one side being effectively connected to the low side of the AC source 18 and the other side thereof being connected to the high side of the AC source 18. Therefore, there is a relatively high voltage disposed across the two terminals of the faulty bulb 32. If one were to utilize a voltmeter across the two electrodes 34 and 36, this voltage could be measured. However, this also would be very time consuming.

Figure 4:
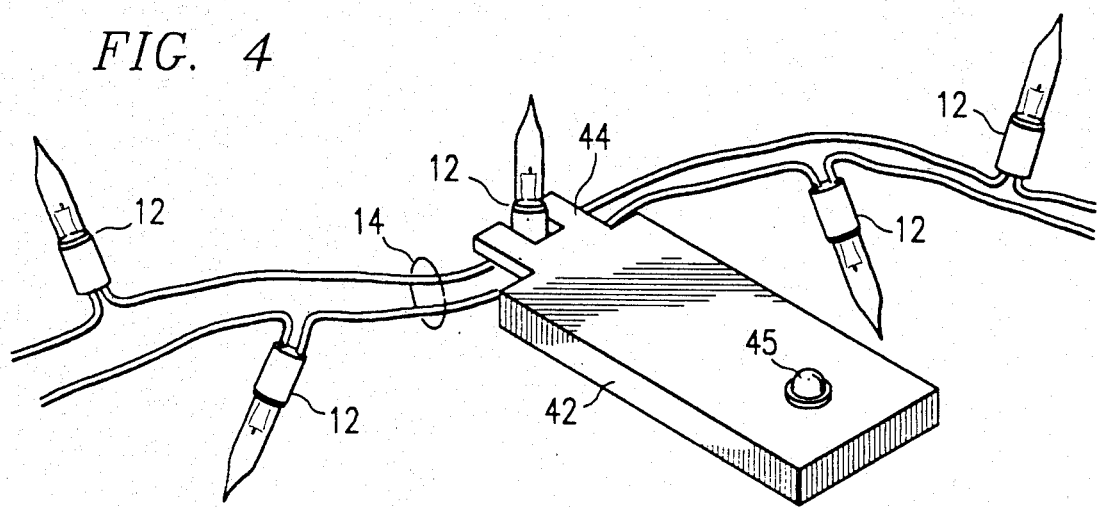
FIG. 4 illustrates a perspective view of the detector and support mechanism of the present invention.

Referring now to FIG. 4, there is illustrated a planar view of a detection device 42 that operates in accordance with the present invention. The detection device 42 is battery operated and is operable to be disposed adjacent each of the bulbs. A probe 44 is disposed on the end of the detector 42, which probe 44 is operable to be inserted around the socket 30 of the lamp 12. An indicator 46, such as a light emitting diode "LED" is provided, which when illuminated indicates the presence of a faulty lamp 12.

In operation, the detector 42 would have the probe 44 sequentially moved from one lamp 12 to the next, starting at the AC plug 16. When a lamp is found that causes an LED 46 to illuminate, this bulb is replaced. This is continued until the last bulb in the string has been tested. In this manner, multiple faulty bulbs can be tested for, it being realized that there must be a voltage on at least one side of the lamp 12, which will be present if the detector 42 is utilized to sequentially test the lamps 12 from the AC plug 16 out to the end of the string.

Figure 5:
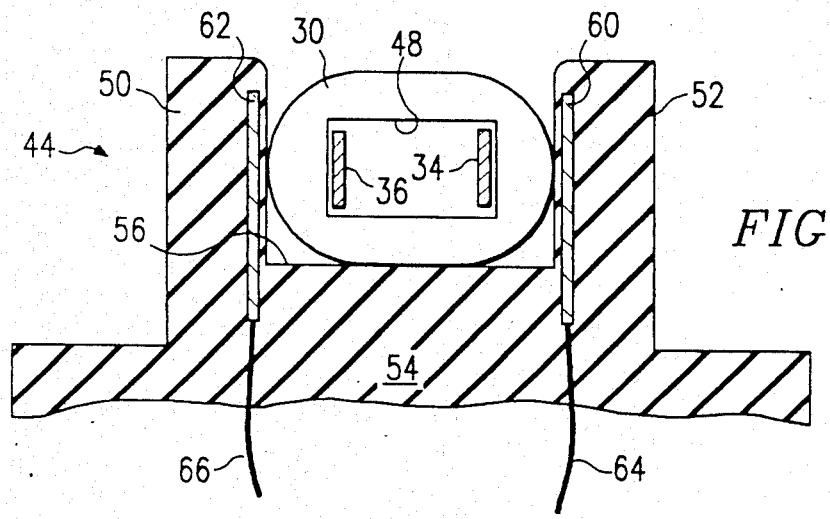
FIG. 5 illustrates a cross sectional view of the support mechanism for the capacitive coupling plates.

Referring now FIG. 5, there is illustrated a cross sectional diagram of the socket 30, illustrating the electrodes 34 and 36. The electrodes 34 and 36 are disposed in a cavity 48. The cavity 48 is rectangular in shape and conforms to the shape of the base of the bulb 32. This is a very conventional shaped element. The probe 44 is comprised of two protrusions 50 and 52 which extend outward from the detector 42 and are joined together by a bridging portion 54. The bridging portion 54 and the two protrusions 50 and 52 extending outward therefrom form a cavity 56 therein. The cavity 56 has the protrusions 50 and 52 disposed relative thereto in a substantially parallel relationship. The protrusions 50 and 52 on the interior of the cavity 56 are disposed a distance apart that is substantially equal to the diameter of the socket 30 when inserted into the cavity 56 such that the electrodes 34 and 36 are in a substantially parallel relationship to the protrusions 50 and 52.

A capacitive plate 60 is disposed in the protrusion 52 proximate to the interior surface thereof adjacent to cavity 56. In a similar manner, a capacitive plate 62 is disposed in the protrusion 50 in a substantially parallel relationship with the interior surface thereof adjacent the cavity 56. The capacitive plates 60 and 62 are substantially parallel to each other and substantially perpendicular to the bridging portion 54. Each of the capacitive plates 60 and 62 has wires 64 and 66 associated therewith and extending into the detector 42. The bridging portions 50 and 52 are typically fabricated from molded plastic with the plate 60 and 62 embedded therein. When the socket 30 is disposed in the cavity 56, the capacitive plates 60 and 62 are substantially perpendicular to the electrodes 34 and 36, respectively. If the socket 30 were rotated at a 90° angle, the detector 42 would not work, as will be described hereinbelow.

Figure 6:
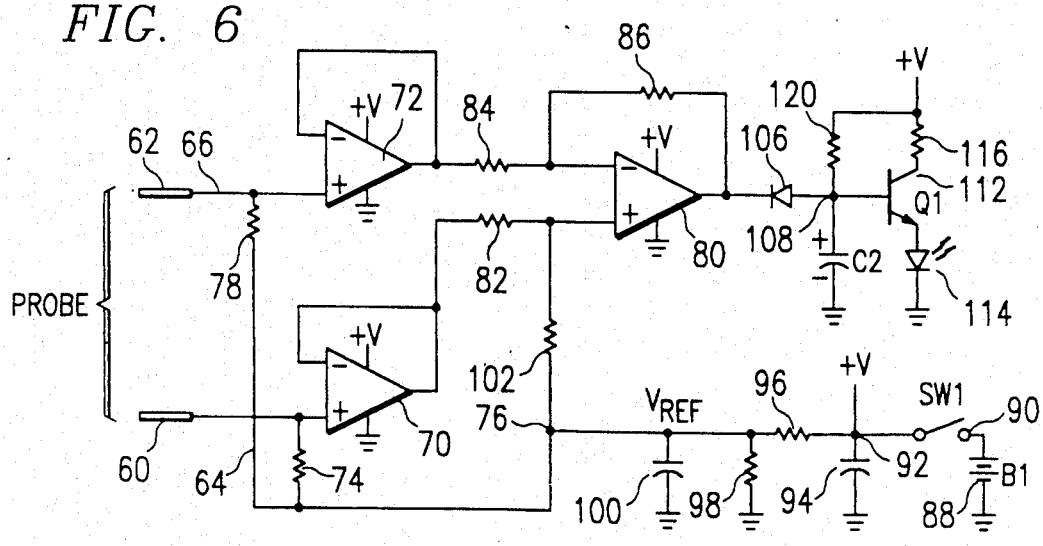
FIG. 6 illustrates a detailed schematic diagram of the detector circuit.

Referring now to FIG. 6, there is illustrated a schematic diagram of the detector 42. The wire 64 from the capacitive plate 60 is connected to the positive input of an operational amplifier (OP AMP) 70. The negative input thereof is connected to the output thereof to form a voltage follower. In a similar manner, the wire 66 associated with the capacitive plate 62 is connected to the positive input of an Op Amp 72, the negative input thereof connected to the output in a voltage follower configuration. Since the coupling provided by the capacitive plates 60 and 62 is a very small capacitance on the order of a fraction of a picoFarad. A very high input impedance is required on the positive input of the Op Amps 70 and 72. In the preferred embodiment, the Op Amps 70 and 72 utilize Part No. CA3140T, manufactured by RCA Corporation, which are BiMOS operational amplifiers. A description of the operation of these voltage follower circuits can be found in Faulkenberry, "An Introduction to Operational Amplifiers with Linear IC Applications," John Wiley & Sons, 1982 (pp. 7-8).

A resistor 74 is connected between a positive input of the Op Amp 70 and a node 76. A resistor 78 is connected between the positive input of the Op Amp 72 and the node 76. The node 76 provides a reference voltage $V_{ref}$. The resistors 74 and 78 provide a high impedance DC return to the voltage on node 76.

The output of Op Amp 70 is connected to the positive input of an Op Amp 70 through a series resistor 82. In a similar manner, the output of Op Amp 72 is connected to the negative input of Op Amp through a series resistor 84. The Op Amp 80 is configured as a differential amplifier with a feedback resistor 86 connected between the negative input thereof and the output. This is a conventional circuit.

A battery 88 is provided having a ground terminal and a positive terminal. The positive terminal is connected to one side of a switch 90, the other side thereof connected to a power supply node 92. The power supply node 92 provides the power supply voltage to all the Op Amps 70, 72, and 80, in addition to the remainder of the circuitry. The voltage node 92 is capacitively filtered with a capacitor 94 connected between node 92 and ground. A resistor 96 is provided in series with the node 92 and the node 76. A resistor 98 is connected between the node 76 and ground, the resistor 96 and the resistor 98 providing a voltage divider. A bypass capacitor 100 is provided which is disposed between node 76 and ground for purposes of high frequency rejection. A series resistor 102 is connected between the positive input of Op Amp 80 and node 76. The resistors 96 and 102 operate to provide the voltage reference $V_{ref}$ at the node 76.

A diode 106 has the cathode thereof connected to a node 108 and the anode thereof connected to the output of the Op Amp 80. Node 108 is connected to the positive side of a capacitor 110, the negative side of the capacitor 110 connected to ground. Node 108 is also connected to the base of an NPN bipolar transistor 112, the emitter of which is connected to the cathode of a light emitting diode (LED) 114 and the anode of which is connected to one side of a resistor 116. The other end of the cathode of LED 114 is connected to ground and the other end of resistor 116 is connected to the power supply voltage on node 92. A series resistor 120 is connected between the positive supply voltage on node 92 and the node 108, resistor 120 providing a bias current to node 108 for the transistor 112.

The diode 106 is operable to rectify the output of amplifier 80 and apply it to a filter consisting of capacitor 110 and the resistor 120. The resistor 120 also biases the transistor 112, described above, in the "on" state. The resistor 116 provides a current limiting operation to the current through the LED 114 to about 20 milliamperes. When an AC voltage is present at the output of the OP AMP 80, the diode 106 conducts and discharges capacitor 110, thus removing base drive from the transistor 112. This results in turning the LED 114 off. Therefore, whenever there is an AC voltage on either the capacitive plate 60 or capacitive 62, this would result in an AC differential voltage being developed across the positive and negative inputs of the OP AMP 80, thus resulting in an AC voltage on the output of the Op Amp 80.

In operation, the capacitive plates 60 and 62 are oriented such that they are parallel and disposed as close as possible to the electrodes 34 and 36 in the socket 30. It is important that they are parallel and disposed more proximate to one of the electrodes 34 and 36 than the other. In this manner, there will not be any cross coupling, such as the electrode 34 being capacitively coupled to both of the probes of the capacitive plates 60 and 62 with an equal capacitance. It is desirable to have more capacitive coupling from, for example, electrode 34 to probe 60.

To facilitate coupling of one of the electrodes 34 or 36 to one of the capacitive plates 60 or 62, it is necessary to orient the socket 30 such that the electrodes 34 and 36 are in a parallel relationship with the capacitive plates 60 and 62. Once this is facilitated, one of the capacitive plates 60 and 62 that receives an alternating voltage coupled thereto that is either at a phase or higher than that coupled to the other capacitive plates 60 and 62 will result in the voltage being impressed across the positive and negative inputs of the differential amplifier.

In order to facilitate testing, it is necessary to have at least one of the electrodes 34 and 36 connected to one side of the AC supply 18. Therefore, testing is facilitated by testing the sockets 30 most proximate to the plug 16, and then sequentially testing each of the sockets 30 outward from the plug 16. In this manner, even with multiple defective bulbs 32, an open circuit can be detected since this open circuit will result in the voltage that is capacitively coupled to either the probe 60 or 62 being different. For example, if multiple bulbs were present and one side of the defective bulb were connected to the low side of the AC source 18 and the other side were connected to another defective bulb, this would result in no voltage being present on one side of the socket 30 and the low side of AC source 18 being disposed on the other side. This would be detected by the detector of the present invention, since the one side is "floating" and, therefore, not connected to a voltage.

In summary, there has been provided a detector for detecting the presence of a defective lamp in a string of lamps disposed in a series configuration, typically utilized as Christmas tree lights. The detector has two capacitive probes that are operable to be disposed on either side of the socket for the lamp. The probes are oriented such that they are parallel to the electrodes of the socket which, for a defective bulb, will result in a voltage being disposed across the socket. This voltage is detected to turn off an LED.

Although the preferred embodiment has been described in detail, it should be understood that various changes, substitutions and alterations can be made therein without departing from the spirit and scope of the invention as defined by the appended claims.

What is claimed is:

1. An apparatus for testing for faulty lights in a string of lights, each light having a light socket with at least first and second contacts provided therein, the first and second contacts being disposed substantially parallel and spaced a predetermined distance apart and operable to place an AC signal across the electrodes of a light bulb which is supported in the socket, the apparatus comprising:

a first capacitive plate;

a second capacitive plate;

a support member for supporting said first and second capacitive plates in a substantially parallel relationship and at a distance greater than that between the first and second contacts, said support having a cavity formed between said first and second capacitive plates for receiving the socket; and a detector circuit for detecting a voltage difference between said first and second capacitive plates.

2. The apparatus of claim 1 wherein said detector circuit comprises:

amplifying circuitry for amplifying with first and second amplifiers the signal received by said first capacitive plate and said second capacitive plate, respectively;

a differential amplifier for receiving on first and second inputs the outputs of said first and second amplifiers, respectively;

a detector for detecting the presence of a signal on the output of said differential amplifier; and display means for outputting an indication that a signal has been detected.

3. The apparatus of claim 2 wherein said display comprises a light emitting diode.

4. The apparatus of claim 3 wherein said light emitting diode is illuminated in the absence of a detected signal.

5. A method for testing for faulty lights in a string of lights, each light having a light socket with at least first and second contacts provided therein, the first and second contacts being disposed substantially parallel and spaced a predetermined distance apart and operable to place an AC signal across the electrodes of a light bulb which is supported in the socket, comprising the steps of:

providing a first capacitive plate;

providing a second capacitive plate;

providing a cavity between the first and second capacitive plates and sized slightly larger than the socket;

supporting the first and second capacitive plates in a substantially parallel relationship and at a distance greater than that between the first and second contacts and within the cavity;

placing the socket in the cavity such that the first and second contacts are disposed substantially proximate to the first and second capacitive plates, respectively; and detecting a voltage difference between the first and second capacitive plates.

6. The method of claim 5 wherein the step of detecting the voltage difference between the first and second capacitive plates comprises the steps of:

amplifying with first and second amplifiers the signals received by the first capacitive plate and the second capacitive plate, respectively;

differentially amplifying the outputs of the first and second amplifiers, respectively and outputting a differentially amplified signal;

detecting the presence of the differentially amplified signal; and displaying an indication that the signal has been detected.

* * * * *